US007176889B2

United States Patent
Baker et al.

(10) Patent No.: US 7,176,889 B2
(45) Date of Patent: Feb. 13, 2007

(54) FORCE SENSING POINTING DEVICE WITH CLICK FUNCTION

(75) Inventors: Jeffrey Ross Baker, Thousand Oaks, CA (US); James Dexter Tickle, Moorpark, CA (US); Carlos Solis Sanchez, Oxnard, CA (US); Scott David Alhart, Soquel, CA (US)

(73) Assignee: Interlink Electronics, Inc., Camarillo, CA (US)

( * ) Notice: Subject to any disclaimer, the term of this patent is extended or adjusted under 35 U.S.C. 154(b) by 496 days.

(21) Appl. No.: 10/851,855

(22) Filed: May 21, 2004

(65) Prior Publication Data

US 2005/0259069 A1    Nov. 24, 2005

(51) Int. Cl.
*G09G 5/00*    (2006.01)
*G09G 5/08*    (2006.01)

(52) U.S. Cl. .................. 345/156; 345/157; 345/161; 345/163; 345/168; 345/169

(58) Field of Classification Search ........ 345/156–169; 200/510–517, 5 A, 5 R; 341/21–34; 463/37–39
See application file for complete search history.

(56) References Cited

U.S. PATENT DOCUMENTS

| 4,489,302 A | | 12/1984 | Eventoff |
| 4,598,181 A | * | 7/1986 | Selby ........................ 200/5 A |
| 4,916,275 A | | 4/1990 | Almond |
| 5,357,065 A | * | 10/1994 | Mitamura et al. .......... 200/5 A |
| 5,430,262 A | * | 7/1995 | Matsui et al. ............... 200/5 A |
| 6,087,925 A | | 7/2000 | DeVolpi |
| 6,121,869 A | | 9/2000 | Burgess |
| 6,198,054 B1 | | 3/2001 | Janniere |
| 6,323,449 B1 | | 11/2001 | Janniere |
| 6,403,898 B2 | | 6/2002 | Janniere et al. |
| 6,531,951 B2 | | 3/2003 | Serban et al. |
| 6,552,287 B2 | | 4/2003 | Janniere |
| 6,621,004 B2 | * | 9/2003 | Cheynet et al. ............... 174/50 |
| 6,756,555 B2 | * | 6/2004 | Lin ............................ 200/512 |

* cited by examiner

*Primary Examiner*—Vijay Shankar
(74) *Attorney, Agent, or Firm*—Brooks Kushman P.C.

(57) ABSTRACT

An input device for an electronic system includes a force sensor having conductive interdigitated traces on a bottom substrate and a flexible substrate spaced apart from the bottom substrate. The flexible substrate has a resistive layer deposited on a bottom side facing the interdigitated traces. A snap dome is positioned over a portion of the force sensor flexible substrate. A flexible keymat membrane is positioned over the force sensor and the snap dome. The keymat membrane bottom surface faces the force sensor flexible substrate. The keymat membrane bottom surface has a protruding region surrounding the snap dome and spaced above the force sensor flexible substrate. A center keycap on the keymat membrane top surface is positioned over the snap dome. A surrounding keycap on the keymat membrane encloses the center keycap and is positioned over the keymat membrane protruding region.

34 Claims, 9 Drawing Sheets

FORCE SENSING POINTING DEVICE WITH CLICK FUNCTION

BACKGROUND OF THE INVENTION

1. Field of the Invention

The present invention relates to directional input devices particularly for use in portable electronic devices.

2. Background Art

Highly portable electronic devices, such as personal digital assistants, portable telephones, remote controls, and the like, provide increasing functionality to their users. This functionality often accompanies an increased need for information from the user. To fulfill this need, portable electronic devices incorporate mouse pointing sensors that provide directional input using a single finger, often from the same hand that holds the electronic device. In addition, many such mouse pointing sensors provide a magnitude signal in relation to force supplied by the user. This force may be applied through a joystick or a mouse button. Many applications also require or are assisted by a selection input. Signals generated by such mouse pointing sensors are conditioned and processed by on-board logic to activate a pointer displayed on a graphical user interface either incorporated into the handheld device or separated from the handheld device, such as with a television remote control.

New portable electronic devices must be light, reliable, and inexpensive. This latter requirement dictates a mouse pointing sensor which is both inexpensive and easily manufacturable into the handheld device. In addition, the mouse pointing sensor must be small. The sensor must not require a large footprint on a handheld device printed circuit board. In addition, the sensor must not require significant vertical distance away from the printed circuit board.

One type of sensor used in portable electronic devices operates with a strain gauge stick. Moving the stick creates strain induced changes in resistance. One difficulty with such devices is that the strain induced resistance change creates a small signal, requiring additional circuitry for amplification and introducing noise susceptibility. In addition, these devices have a flex circuit tail which requires a connector on the printed circuit board. The sensor is often mechanically mounted to the printed circuit board with screws. Thus, both the device and its manufacture into a portable electronic system is expensive.

Another sensor type is the Force Sensing Resistor™ (FSR). Various FSRs have been disclosed, such as those described in commonly assigned U.S. Pat. Nos. 4,314,227 and 4,314,228, each of which is hereby incorporated by reference in its entirety. Typically, an FSR is composed of three parts: a base, a spacer, and a resistive membrane. The flexible resistive membrane is spaced apart from the base layer by a spacer, which is typically a ring of material around the outer edge of the conductive traces. The spacer is also typically coated with adhesive to hold the device together. The flexible top membrane may be made of a polymer coated on its inner face with semi-conductive or resistive ink, giving the FSR force sensing properties. This ink is described in commonly owned U.S. Pat. Nos. 5,296,837 and 5,302,936, each of which is hereby incorporated by reference in its entirety.

Conductive traces within the FSR are typically arranged in separated interdigitated sets on the base. These traces may be configured in a single zone or, more relevant to the present invention, in multiple zones allowing pointing devices as described in commonly assigned U.S. Pat. No. 5,659,334, which is hereby incorporated by reference in its entirety.

For use in portable electronic devices, the FSR must be connected to sensing and conditioning electronics. One way this may be accomplished is by connecting the FSR to a printed circuit board through a multi-conductor cable. Another way of connecting the FSR to support electronics is to adhere the FSR base directly to a printed circuit board containing the electronics through z-tape. Z-tape is adhesive on both sides and conducts electricity in a direction perpendicular to the tape surface. While either of these methods is effective, both have manufacturing steps and components which are necessary only for mounting purposes. If these components and their associated manufacturing steps could be eliminated, the cost of any system containing such an FSR could be reduced. In addition, the reliability of such a system would be increased.

What is needed is a mouse pointing transducer and selecting device as well as a method of manufacturing such a device into a portable electronic device that eliminates unnecessary components and requires fewer manufacturing steps without sacrificing transducer performance.

SUMMARY OF THE INVENTION

The present invention decreases the cost and complexity of an electronic mouse pointing device by constructing the device in a manner permitting assembly into user interfaces with industry standard high volume automated manufacturing processes. In addition, the present invention allows input to the pointing transducer to be measured with a minimum of external circuitry and with a minimum of noise susceptibility.

The present invention includes an input device for an electronic system. The input device includes a force sensor having conductive interdigitated traces on a bottom substrate and a flexible substrate spaced apart from the bottom substrate. The flexible substrate has a resistive layer deposited on a bottom side facing the interdigitated traces. A snap dome is positioned over a portion of the force sensor flexible substrate. A flexible keymat membrane is positioned over the force sensor and the snap dome. The keymat membrane bottom surface faces the force sensor flexible substrate. The keymat membrane bottom surface has a protruding region surrounding the snap dome and spaced above the force sensor flexible substrate. A center keycap on the keymat membrane top surface is positioned over the snap dome. A surrounding keycap on the keymat membrane encloses the center keycap and is positioned over the keymat membrane protruding region.

In an embodiment of the present invention, the surrounding keycap is annular in shape.

In another embodiment of the present invention, the interdigitated traces include a first set of interdigitated traces beneath the snap dome and at least one second set of interdigitated traces in a region around the first set of interdigitated traces. The second set of interdigitated traces may be a plurality of sets of interdigitated traces with each set of interdigitated traces formed in a portion of the region around the first set of interdigitated traces. In addition, one trace in the first set of interdigitated traces may be a common trace electrically connected with one trace in each of the at least one second set of interdigitated traces.

The input device may also include a spacer region encircling the first set of interdigitated traces and separating the first set of interdigitated traces from the at least one second set of interdigitated traces. The snap dome rim may then be positioned above the spacer region.

In still another embodiment of the present invention, the force sensor includes a raised pedestal formed on the bottom substrate around at least a portion of the interdigitated traces. The pedestal spaces the interdigitated traces apart from the flexible substrate resistive layer. An adhesive spacer layer joins the flexible substrate to the bottom substrate.

In yet another embodiment of the present invention, the snap dome is affixed to a snap dome carrier membrane.

In a further embodiment of the present invention, the center keycap extends a lesser distance above the keymat membrane then the surrounding keycap extends above the keymat membrane.

In a still further embodiment of the present invention, the center keycap and the surrounding keycap are affixed to the keymat membrane.

In yet a further embodiment of the present invention, the keymat membrane includes a force transmitting member surrounded by the protruding region that contacts the snap dome. The force transmitting member may be formed by a portion of the center keycap protruding into the keymat membrane.

A pointing device for integrating into portable electronic devices is also provided. A bottom substrate top face includes a sensing region with interdigitated conductive trace regions. Each trace region includes interdigitated common and sense traces. The bottom substrate defines at least one via through the bottom substrate for each sense trace and the common trace. Each via supports a conductive path from one trace to at least one lead element. The bottom face supports at least one lead element for each sense trace and the common trace. Each lead element is solderable to a printed circuit board. A flexible substrate has a resistive layer deposited on a bottom side. A raised pedestal is formed on the bottom substrate top face around at least a portion of the sensing region. The pedestal separates the interdigitated conductive traces from the flexible substrate resistive layer. A snap dome is over the flexible substrate. A keymat membrane covers the snap dome and the flexible substrate. The keymat membrane defining a protruding region surrounding the snap dome. A center keycap is positioned on the keymat membrane opposite the snap dome. A surrounding keycap is positioned on the keymat membrane opposite the keymat membrane protruding region.

Depressing the center keycap collapses the snap dome and brings a portion of the flexible substrate under the snap dome into contact with the bottom substrate sensing region. Depressing the surrounding keycap pushes a portion of the flexible substrate protruding region which, in turn, pushes a portion of the flexible substrate under the portion of the flexible substrate protruding region into contact with the bottom substrate sensing region.

The present invention also includes a pointing device for integrating into portable electronic devices having a bottom substrate upon which is formed a central set of interdigitated conductive traces in a circular region. An annular region surrounding the central set of interdigitated conductive traces on the bottom substrate top face includes sets of interdigitated conductive traces. A flexible substrate with a resistive layer deposited on a bottom side is spaced above and facing the bottom substrate. A switch assembly is positioned over the flexible substrate such that a central keycap is above the central set of interdigitated conductive traces and an annular keycap is over the annular region.

The present invention also contemplates an input device including a bottom substrate upon which is formed a central sensing region of interdigitated conductive traces. A separation region surrounds the central sensing region and is raised above the bottom substrate. A peripheral sensing region, formed around the separation region, includes sets of interdigitated conductive traces formed on the bottom substrate. A raised pedestal is formed on the bottom substrate top face around at least a portion of the peripheral sensing region. A flexible substrate on the raised pedestal extends over the central sensing region, the separation region and the peripheral sensing region. The flexible substrate has a resistive layer deposited on a bottom side facing the central sensing region and the peripheral sensing region. A snap dome membrane to which is affixed a snap dome is positioned over the flexible substrate so that the dome rim is above the separation region. Compressing the snap dome forces the resistive layer on the flexible substrate above the central sensing region against the central sensing region but does not force the resistive layer on the flexible substrate above the peripheral sensing region against the peripheral sensing region.

A method of making a surface mountable pointing device is also provided. A thin bottom substrate material is formed to have a top surface area of sufficient size to support a plurality of pointing devices. For each pointing device supported, through holes are formed in the bottom substrate material. At least one set of sensing conductive traces is formed in a central sensing region of the bottom substrate top surface. Each set of sensing conductive traces includes at least two electrically separate interdigitated sensing traces. A plurality of sets of sensing conductive traces is formed in a peripheral sensing region surrounding the central sensing region. At least one connecting conductive trace is formed from each sensing conductive trace in the central sensing region and the peripheral sensing region to and into at least one of the through holes. An insulative material is deposited on the bottom substrate top surface substantially around each peripheral sensing region so as to form a raised pedestal. A high temperature resistant flexible substrate, sized to substantially cover the bottom substrate top surface, is coated with a resistive material on a bottom surface. The flexible substrate bottom surface is adhered to the bottom substrate top surface such that, for each pointing device supported, resistive material is suspended above the central sensing region and the peripheral sensing region. A snap dome support membrane is adhered to the top surface of the flexible substrate. The snap dome support membrane includes one snap dome for each pointing device supported. The snap dome membrane is positioned such that each snap dome is over one of the central sensing regions. The bottom substrate is diced to separate each pointing device.

In an embodiment of the present invention, at least one conductive terminal is formed for at least one through hole. Each conductive terminal facilitates soldering the pointing device to a printed circuit board.

In another embodiment of the present invention, dicing cuts through at least one through hole such that the through hole forms a via along a side of the pointing device normal to the bottom substrate top surface.

In yet another embodiment of the present invention, a plurality of printed circuit board traces are formed on a printed circuit board. The bottom substrate is soldered to the plurality of traces on the printed circuit board. A keypad membrane defining an annular protruding portion is formed on a bottom side of the keypad membrane. The keypad membrane is positioned over the printed circuit board such that the annular protruding portion of the keypad membrane is positioned above the peripheral sensing region. A center keycap is adhered to the keypad membrane top surface so as to be positioned above the snap dome. An annular keycap is adhered to the top surface of the keypad membrane opposite the annular protruding portion and around the center keycap.

In still another embodiment of the present invention, a raised separation region is formed on the bottom substrate top surface for each pointing device supported. The raised separation region separates the central sensing region from the peripheral sensing region. Adhering the snap dome support membrane positions the snap dome for each pointing device such that the snap dome rim is over the raised separation region.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 8a–8i are processing drawings illustrating manufacturing of a pointing device according to an embodiment of the present invention.

DETAILED DESCRIPTION OF THE PREFERRED EMBODIMENT(S)

Figure 1A:
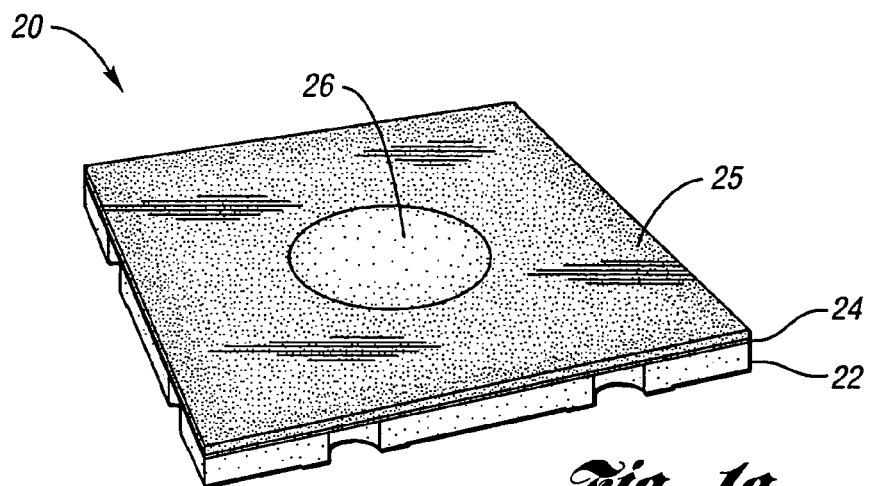
FIGS. 1a, 1b and 1c are perspective views illustrating an input device according to an embodiment of the present invention.
Figure 1B:
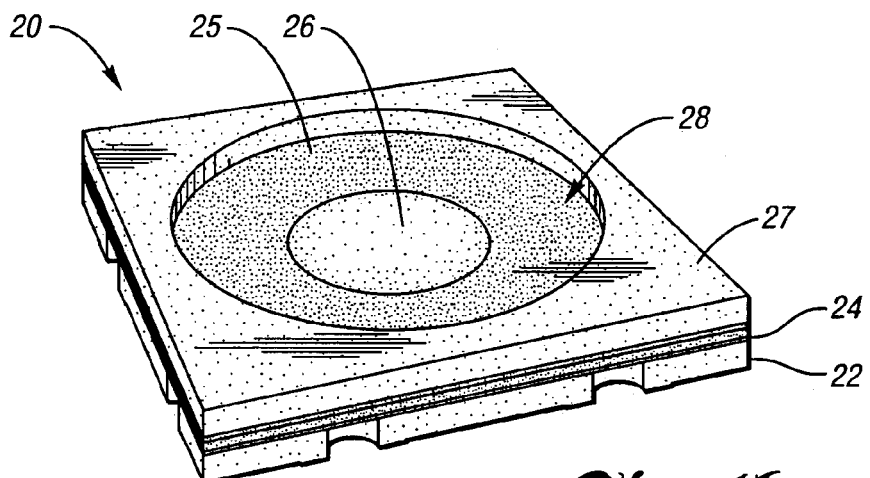
Figure 1C:
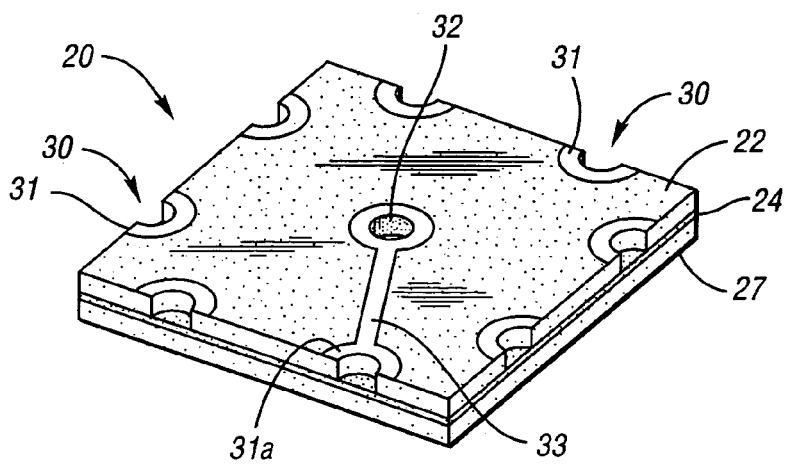

Referring to FIGS. 1a–1c, perspective views illustrating an input device according to an embodiment of the present invention are shown. An input device, or pointing device shown generally by 20, includes bottom substrate 22, flexible substrate 24 and snap dome membrane 25. Snap dome membrane 25 positions snap dome 26 over flexible substrate 24. In the embodiment shown in FIGS. 1b and 1c, top substrate 27 is placed over snap dome membrane 25. Top substrate 27 defines opening 28 allowing snap dome 24, when properly compressed, to push flexible substrate 24 onto a contact area on bottom substrate 22. In some embodiments of the present invention, top substrate 27 may be eliminated, as is illustrated in FIG. 1a.

Bottom substrate 22 defines a plurality of vias 30 passing through bottom substrate 22. The bottom side of bottom substrate 22 includes annular conductors 31 surrounding the openings for vias 30. The inside of vias 30 are also conductive. Annular conductors 31 may be directly soldered to printed circuit boards receiving pointing device 20. This eliminates the need for connective cabling, connectors, z-tape, and the like. Alternatively, vias 30 may support other types of lead elements such as legs, balls, and the like. Bottom substrate 22 may also include central via 32 running through bottom substrate 22. Conductor 33 connects central via 32 with annular conductor 31a.

Figure 2:
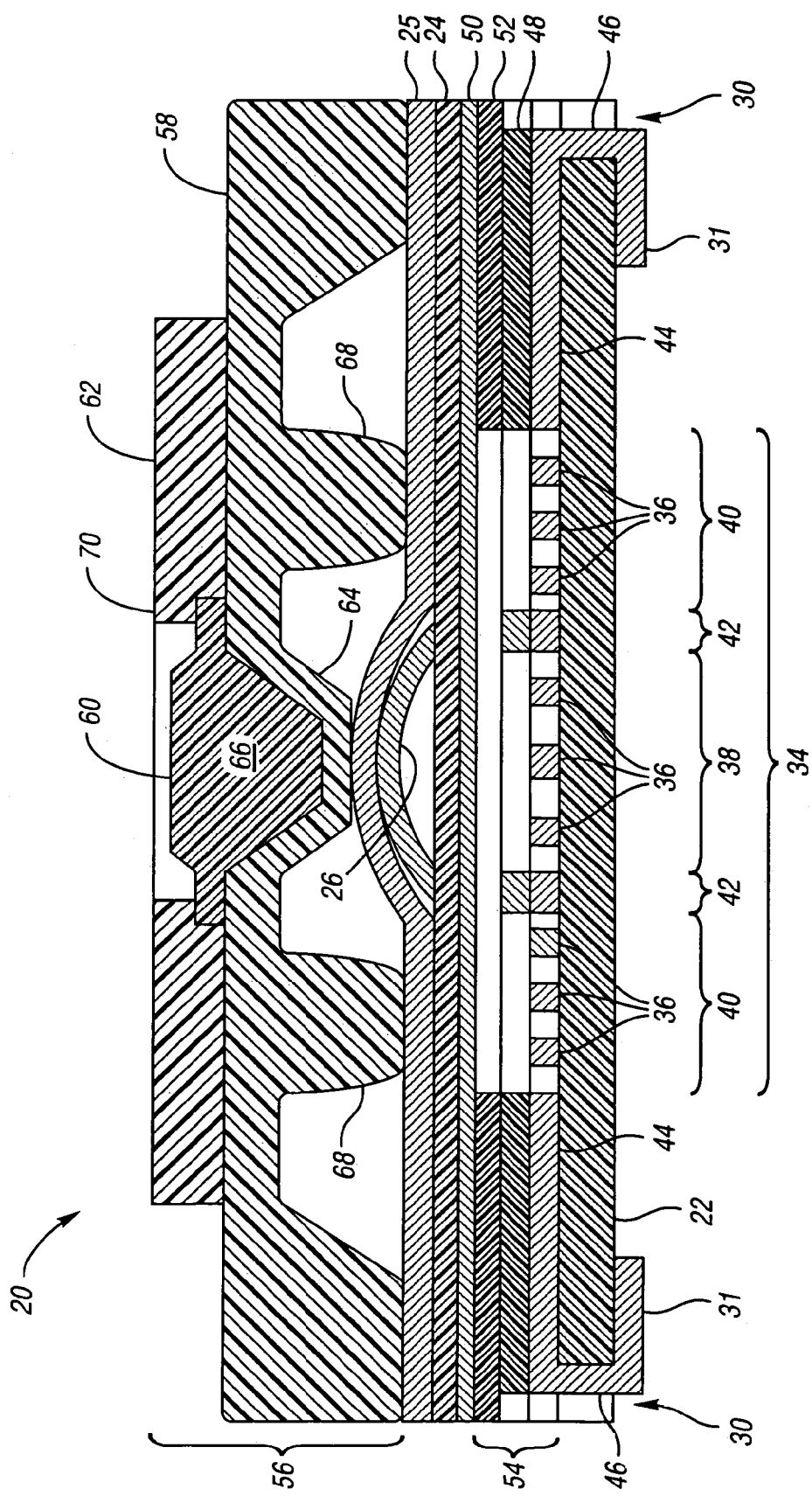
FIG. 2 is a conceptualized cross-sectional diagram illustrating a pointing device according to an embodiment of the present invention.

Referring now to FIG. 2, a conceptualized cross-sectional diagram illustrating a pointing device according to an embodiment of the present invention is shown. The various layers shown in FIG. 2 are not drawn to scale but are illustrated in a manner to better show the construction of pointing device 20.

Bottom substrate 22 defines sensing region 34 to include a plurality of sensing conductive traces 36. As will be illustrated below, traces 36 are interdigitated. Sensing region 34 may be divided into separate sensing regions. For example, central sensing region 38 may be separated from surrounding sensing region 40 by separation region 42. Sensing conductive traces 36 are joined by connecting conductive traces 44 to vias 30. Through plating 46 in each via 30 connects connecting conductive traces 44 with lead elements 31.

Soldermask 48 is deposited on the top surface of bottom substrate 22 around at least part of sensing region 34. Soldermask 48 protects connecting conductive traces 44 and provides spacing above sensing conductive traces 36. Soldermask 48 may also be deposited on conductive traces to form separation region 42.

Flexible substrate 24 is at least partially covered on a bottom side with resistive layer 50. Preferably, resistive layer 50 is a semiconductive or resistive ink such as is described in U.S. Pat. Nos. 5,296,837 and 5,302,936. This ink may be screen printed onto flexible substrate 24 in at least the region above sensing region 34. Flexible substrate 24 is preferably constructed from a high temperature material such as KAPTON, a polyimide film by DuPont, UPILEX from UBE Industries, Ltd., IMIDEX from Westlake Plastics, Crystalline PEEK from Victrex, PLC, and the like. Flexible substrate 24 is assembled to bottom substrate 22 with adhesive layer 52 so that resistive layer 50 faces sensing conductive traces 36 in sensing region 34. Connecting conductive traces 44, Soldermask 48 and adhesive layer 52 form pedestal 54 spacing resistive layer 50 from sensing region 34.

Adhesive layer 52 may be a heat activated film adhesive such as Bonding Film 583 from 3M Corporation. This material can be die cut or laser cut into the correct pattern and then stored until assembly. The bonding film may be activated and cured when exposed to approximately 120° C. and moderate pressure.

Snap dome 26 provides tactile response for user selection. Snap dome 26 may be a metal some with a diameter of 4 mm and a trip force of 300 g. Other sizes and trip forces could be used based on the application, device size, and crispness of the desired tactile feel. Snap dome 26 is adhered to the top surface of flexible substrate 24 by snap dome membrane 25. As is known in the art, snap domes 26 are supplied on a sheet of adhesive-coated plastic film, referred to here as snap dome membrane 25. Snap dome 26 is adhered to the bottom side of snap dome film 25 such that, when snap dome membrane is adhered to the top of flexible substrate 24, snap dome 26 is sandwiched in place above central region 38. Snap dome membrane 25 may include small vent slits near snap dome 26 to permit air to escape. When compressed, snap dome 26 collapses, pushing resistive layer 50 of flexible substrate 24 onto conductive traces 36 of central region 38 thereby forming electrical connections. Preferably, snap dome 26 is positioned so that its bottom rim will sit above separation region 42.

In an embodiment of the present invention not illustrated in FIG. 2, top substrate 27 is affixed to snap dome membrane 25 by an adhesive layer such as adhesive layer 52. Bottom substrate 22 and top substrate 27 are preferably made from a rigid material such as FR4. Adhesive layer 52 may be a high temperature adhesive such as B9021-6 EPO-TEK, a b-stage epoxy from Epoxy Technology of Billerica, Mass. This material can be screen printed on both sides of flexible substrate 24 and partially set by exposure to 80° C. for two minutes. Flexible substrate so coated may then be stored until a time when pointing device 20 is assembled. Adhesive layer 52 are then reactivated and further set by exposure to 150° C. for thirty minutes. Alternatively, adhesive layer 52 may be a bonding film such as Bonding Film 583 from 3M Corporation.

In an embodiment of the present invention, pointing device 20 includes actuator 56 positioned over flexible substrate 24 and snap dome 26. Actuator 56 includes keymat membrane 58, center keycap 60 and surrounding keycap 62 which encircles center keycap 60. Keymat membrane 58 includes force transmission region 64 positioned above snap dome 26. Force transmission region 64 may be formed entirely with keymat membrane 58 or, as preferably illustrated in FIG. 2, by bottom portion 66 of center keycap 60 protruding into keymat membrane 58. When center keycap 60 is depressed with sufficient force, protruding region 64 collapses snap dome 26.

Keymat membrane 58 also defines protruding region 68 extending from beneath a region of keymat membrane 58 above which is positioned surrounding keycap 62. Depressing a portion of surrounding keycap 62 forces a corresponding portion of protruding region 68 to deflect resistive layer 50 on the bottom of flexible substrate 24 against conductive traces 36 in surrounding sensing region 40 thereby forming electrical connections.

Preferably, center keycap 60 extends a shorter distance above the height of keymat membrane 58 than extends the height of surrounding keycap 62. However, the relative heights of center keycap 60 and surrounding keycap 62 may be adjusted to suit various designs and user preferences. Surrounding keycap 62 may include overlap portion 70 which extends above a portion of center keycap 60. Overlap portion 70 helps to retain center keycap 60 preventing, for example, keycap 60 from falling out due to mechanical wear or destructive actions.

Keymat membrane 58 may be constructed of a suitable flexible material such as silicone. Such silicone membranes are typically used in electronic devices such as cellular phones and remote controls. Typically, material with a hardness between 45 and 70 Shore A is used. Center keycap 60 and surrounding keycap 62 may be constructed of a rigid polymer, such as polycarbonate, that can be adhered to keymat membrane 58. Preferably, keymat membrane 58 is thin enough such that center keycap 60, when depressed by a user, moves largely independently of surrounding keycap 62. Keymat membrane 58 may be part of a larger membrane supporting multiple buttons such as are commonly found in cell phones, PDAs, remote controls, and the like.

Figure 3:
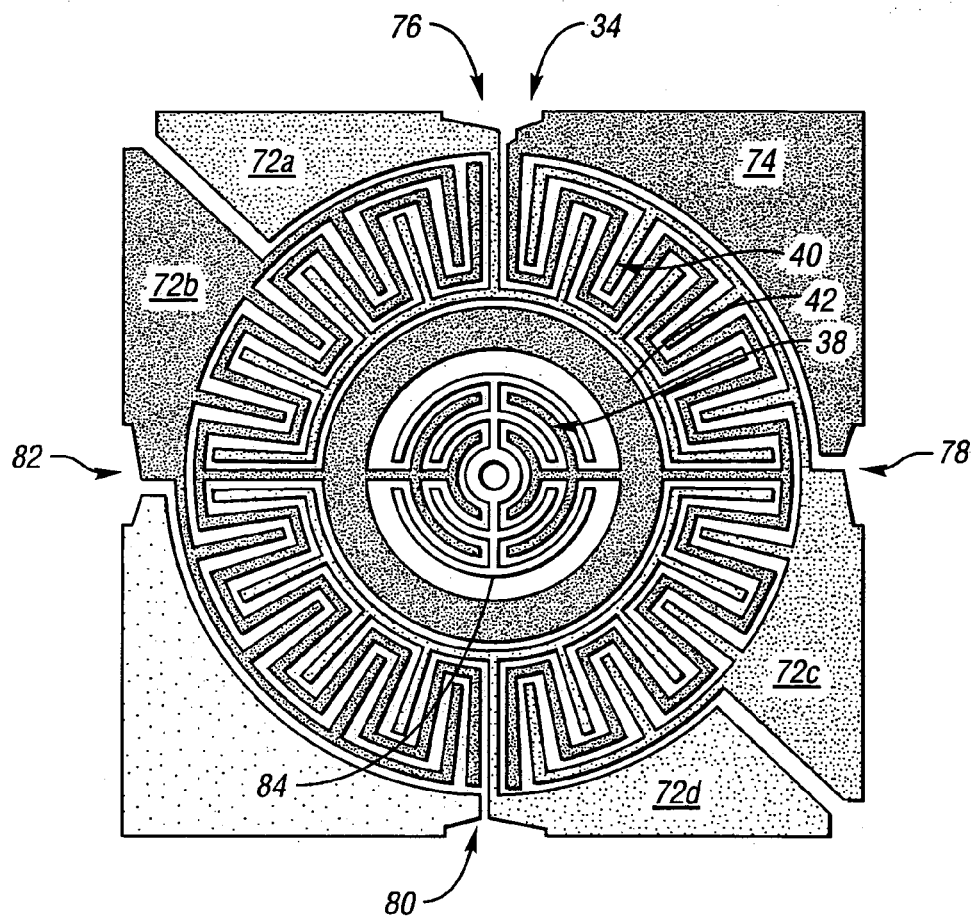
FIG. 3 is a schematic diagram illustrating a sensing region according to an embodiment of the present invention.

Referring now to FIG. 3, a schematic diagram illustrating a sensing region according to an embodiment of the present invention is shown. Sensing region 34 includes central sensing region 38 separated from surrounding sensing region 40 by separation region 42. Surrounding region 40 includes four sense traces 72a, 72b, 72c, and 72d and common trace 74. Common trace 74 is interdigitated with sense traces 72. This creates four overlapping contact regions indicated generally by north region 76, east region 78, south region 80 and west region 82. When resistive layer 50 makes contact with traces 72, 74, a resistive path is formed. Measuring this resistance provides an indication as to the area of resistive layer 50 in contact as well as the location of contact. Thus, a depression of a portion of surrounding keycap 62 can be interpreted as a direction input by the user. Center trace 84 is interdigitated with common trace 74 in central region 68. When resistive layer 50 makes contact with traces 74, 84 a resistive path is formed which can be measured to detect the collapse of snap dome 26. Center trace 84 may connect with support electronics through a via in the center of central region 38. As will be appreciated by one of ordinary skill in the art, other interdigitated patterns may be used with the present invention to form four or any other number of contact regions.

Figure 4:
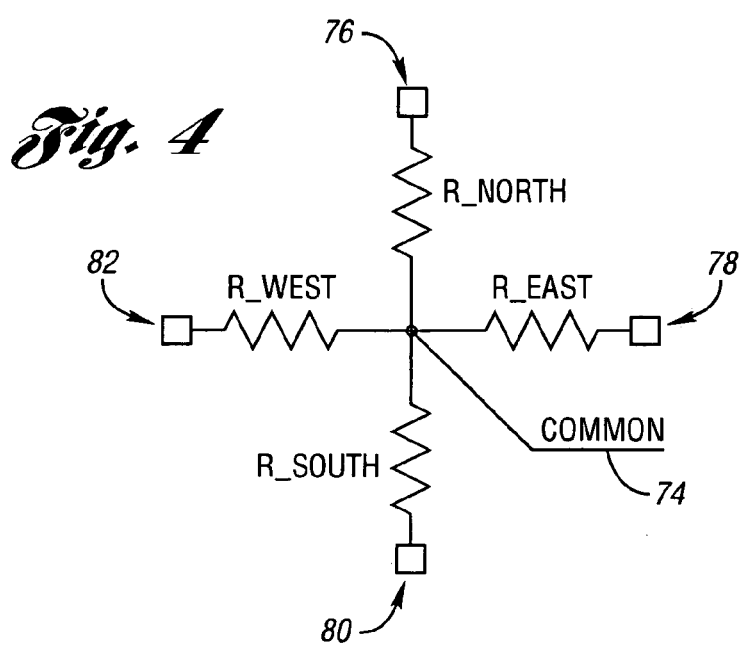
FIG. 4 is a circuit diagram illustrating an equivalent circuit for a sensing region according to an embodiment of the present invention.

Referring now to FIG. 4, a schematic diagram illustrating an equivalent circuit for a sensing region according to an embodiment of the present invention is shown. Each contact region 76, 78, 80, 82 in surrounding sensing region 40 may be represented with a resistance value. For example, north region 76 is modeled with resistor R_North. When no force is applied to flexible substrate 24, these resistances are extremely high. When pressure is applied to flexible substrate 24 such that resistive layer 50 contacts traces 36, a measurable value of resistance is obtained. By scanning each resistance value in turn, the position and force applied to surrounding keycap 62 can be determined.

Figure 5:
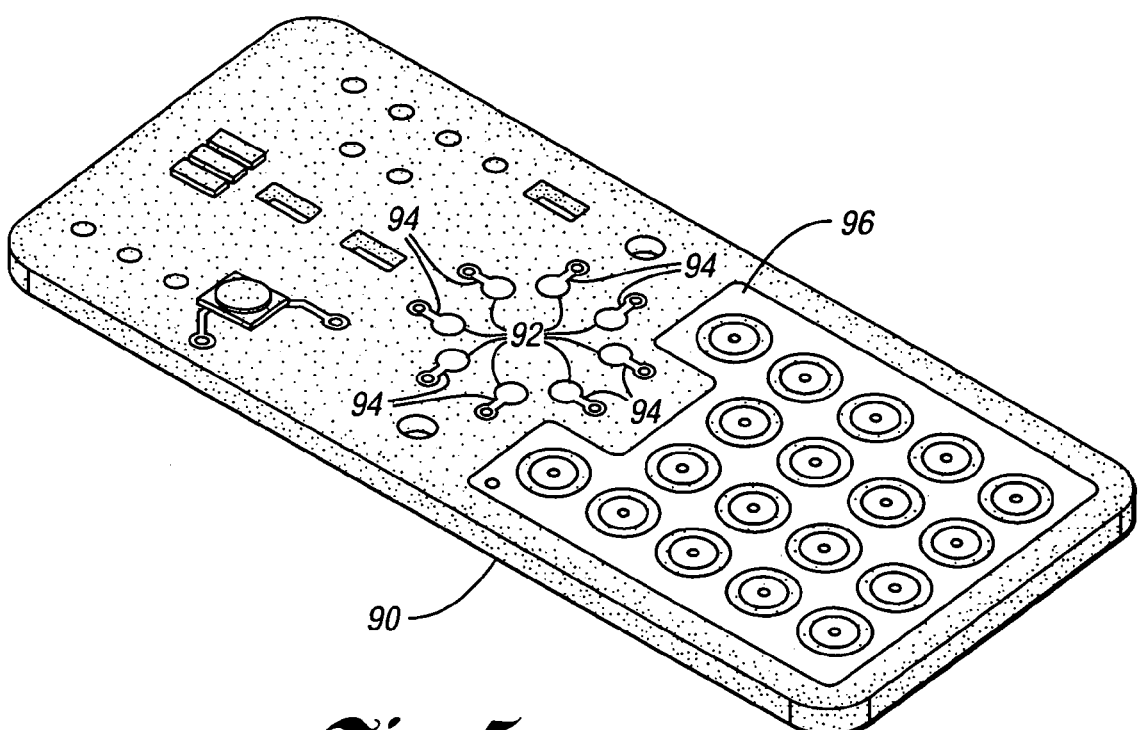
FIG. 5 is a perspective drawing illustrating a printed circuit board for a portable user interface according to an embodiment of the present invention.

Referring now to FIG. 5, a perspective drawing illustrating a printed circuit board for a portable user interface according to an embodiment of the present invention is shown. Printed circuit board 90 includes pads 92 for accepting pointing device 20. Traces 94 lead from pads 92 for connection to electronics preferably on the opposite side of printed circuit board 90. Printed circuit board 90 also includes pads 96 for electrically and mechanically attaching a key switch, dome switch, dome switch array, or the like. Typically, printed circuit board 90 may be the main user interface board of a device such as a cell phone that may include an array of dome switches for a numeric keypad as well as other buttons. Traces on printed circuit board 90, such as traces 94, vary in pitch, trace width and spacing, depending on the application. Typical pitch is 0.008 inches (0.2 mm). Traces 94 are typically covered with soldermask to prevent corrosion and, therefore, no protective plating is required.

Figure 6:
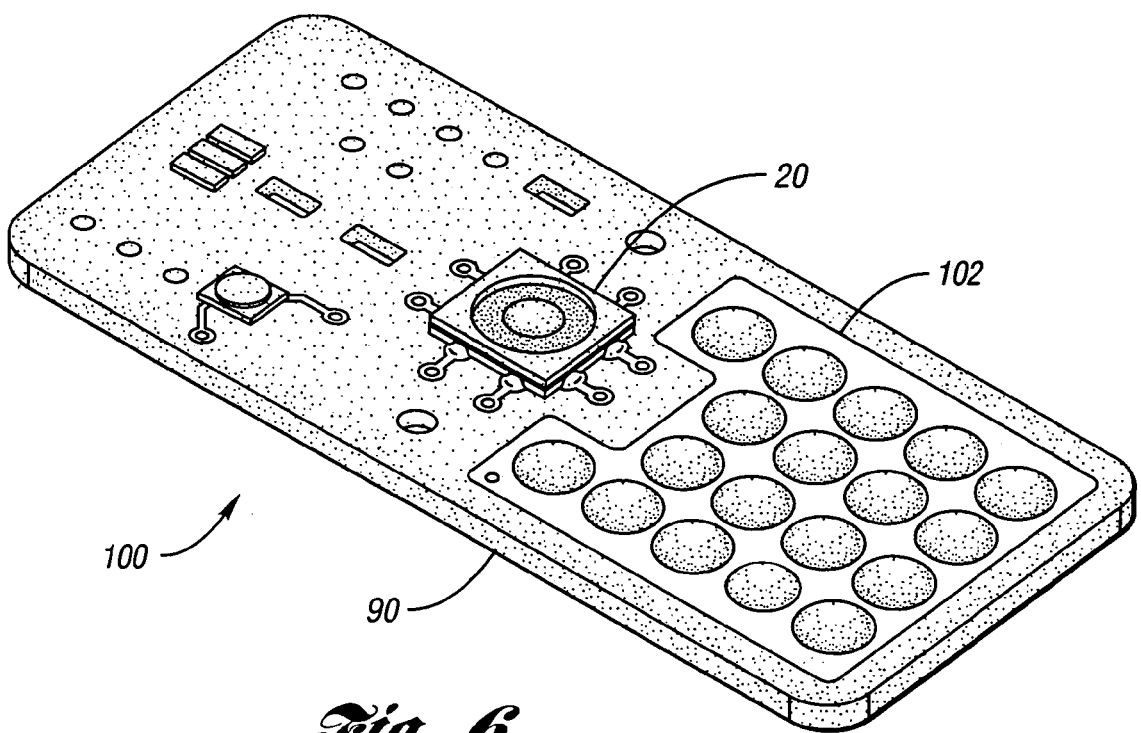
FIG. 6 is a perspective drawing illustrating a printed circuit board assembly for a portable user interface according to an embodiment of the present invention.

Referring now to FIG. 6, a perspective drawing illustrating a printed circuit board assembly for a portable user interface according to an embodiment of the present invention is shown. Printed circuit board assembly, indicated generally by 100, includes printed circuit board 90 onto which has been soldered pointing device 20 and at least one key switch, dome switch, or the like, illustrated by 102. Pointing device 20 is constructed to permit placement with standard automation, such as by a pick-and-place machine. In addition, pointing device 20 is solderable using any standard, mass production soldering technique such as, for example, solder reflow.

The construction and integration of switches 102 is well known in the art. One type of switch 102 shorts key switch traces together using a carbon-filled rubber pill. The pill for each switch is molded into the back of a keypad membrane. Another type of switch shorts switch traces together by the temporary collapsing of a metal snap dome. The metal snap domes for a plurality of switches are typically held in a carrier membrane, such as snap dome membrane 25, which positions the snap domes. The membrane includes a cutout for each dome to permit contact of the switch traces. The keypad membrane fits over the domes. A user depressing a key on the keypad membrane collapses the corresponding dome. Yet another type of switch is a surface-mountable microswitch. As will be recognized by one of ordinary skill in the art, the present invention integrates with any type of switch.

Figure 7:
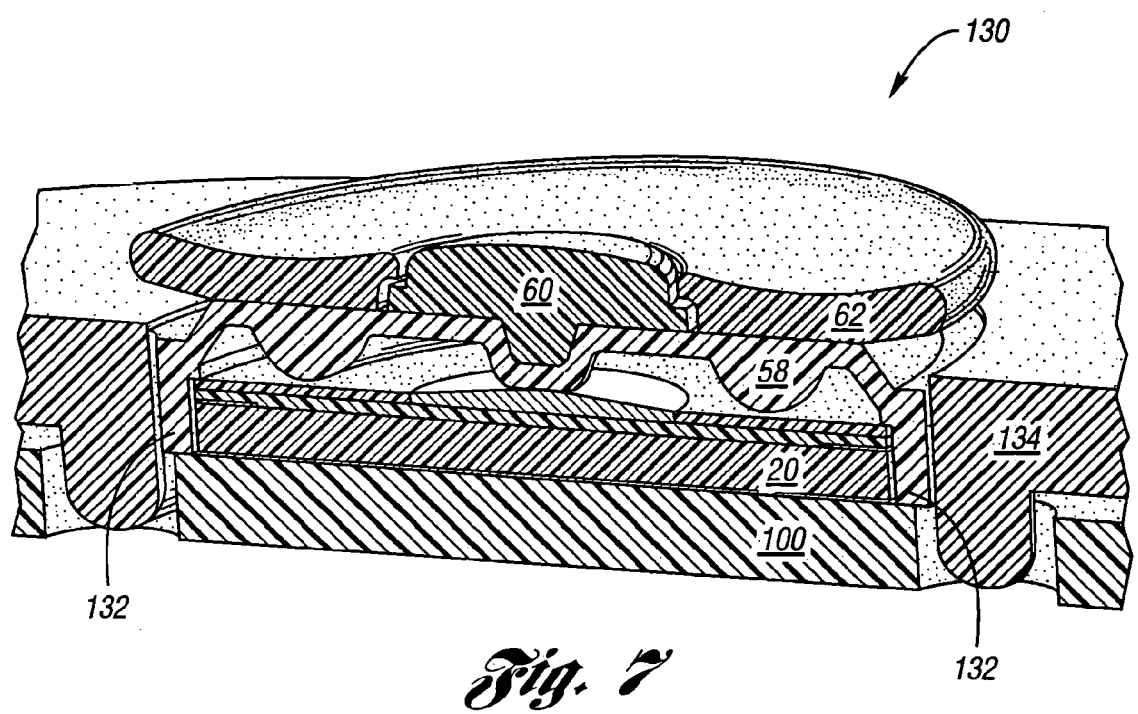
FIG. 7 is a cross-sectional drawing of a portable user interface according to an embodiment of the present invention.

Referring now to FIG. 7, a cross-sectional drawing of a portable user interface according to an embodiment of the present invention is shown. A portable user interface, shown generally by 130, includes pointing device 20. Pointing device 20, shown without the detail illustrated in FIG. 2, is soldered to printed circuit board 100. Keymat membrane 58 includes extensions 132 positioned to fit around bottom substrate 22 and sit on printed circuit board assembly 100 Cover 134 holds keymat membrane 58 to printed circuit board assembly 100. There may also be a bottom protective cover underneath printed circuit board assembly 100, not shown in FIG. 7.

Referring now to FIGS. 8a–8i, processing drawings illustrating manufacturing of pointing devices according to an embodiment of the present invention are shown. Pointing devices 20 of the present invention are easily mass produced. The following discussion describes simultaneously manufacturing one hundred pointing devices. As will be recognized by one of ordinary skill in the art, this method may be easily modified to manufacture any number of pointing device.

Figure 8A:
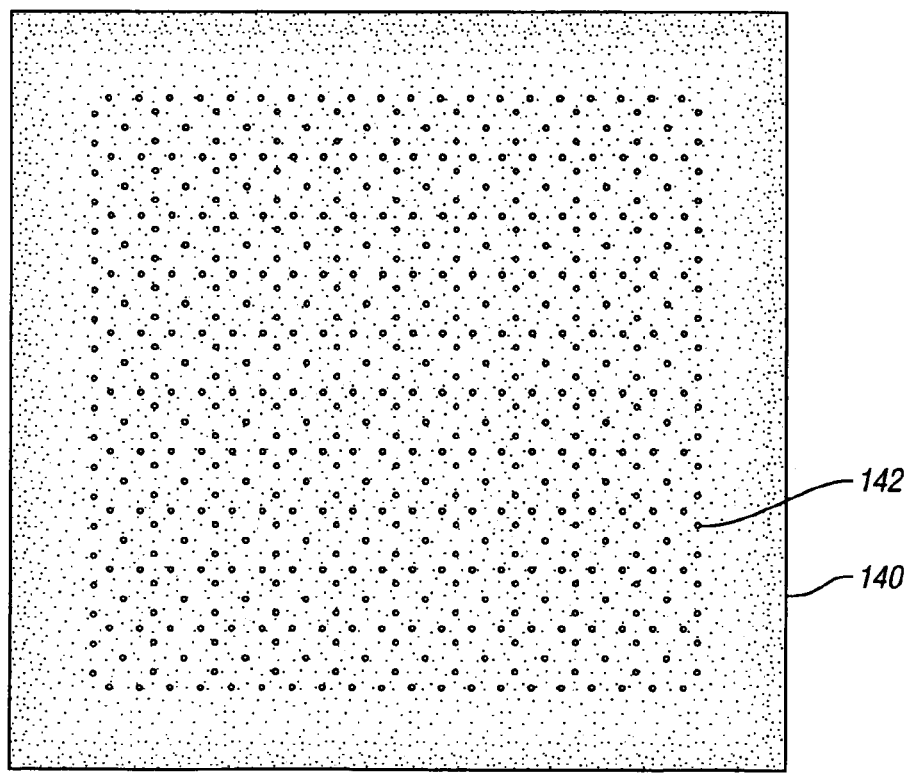

FIG. 8a illustrates the outline and drill pattern for first board 140. First board 140 is preferably FR4 having a thickness of 0.020 inches (0.508 mm). First board 140 is 4.72 inches (120.0 mm) along each side. A plurality of holes, one of which is indicated by 142, are formed in first board 140. These holes become vias that run along the side of each pointing device and/or holes through substrate 22 of each pointing device. This first board 140 and various subsequent layers may include alignment marks or holes, not shown for clarity, to allow layers to be precisely aligned and to guide the dicing operation.

Figure 8B:
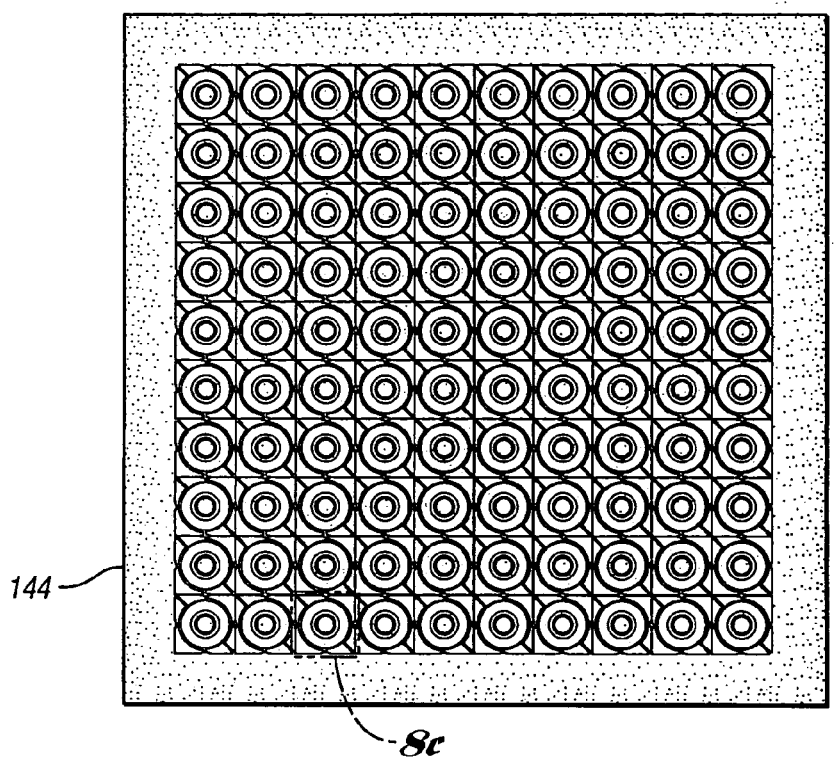
Figure 8C:
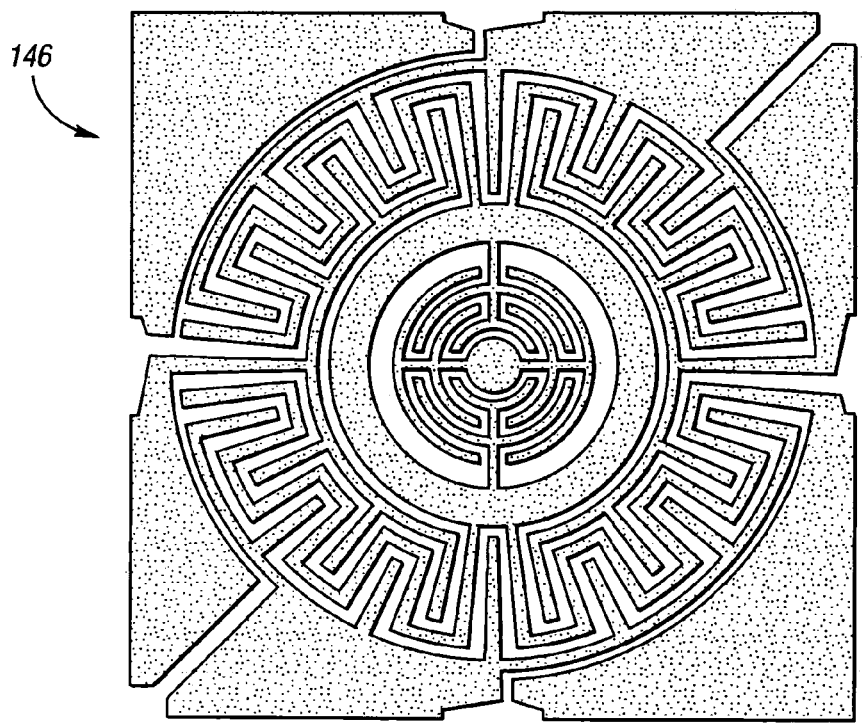
Figure 8B:
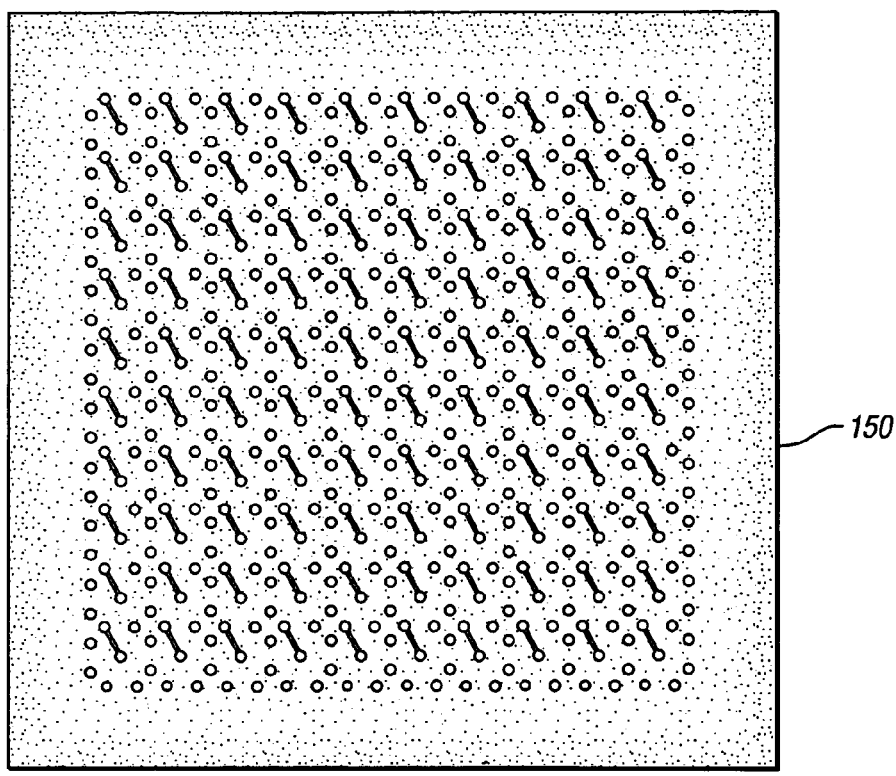

FIGS. 8b and 8c illustrates front copper pattern 144 for first board 140. Front copper pattern 144 defines the contact area for each pointing device 20. The pattern for one device, referenced generally by 146, is shown in FIG. 8c. For each device 20, sensing region 34 is formed with copper traces having a thickness of approximately 0.0007 inches (0.018 mm) to be plated with approximately 100 microinches (2.5 μm) of nickel then approximately 30 microinches (0.8 μm) of gold. Gold is added to increase durability and to protect against copper oxidation. Traces within sensing region 34 have a typical space-and-trace distance of 0.005 inches (0.127 mm). One advantage of the present device is that the fine trace pitch and gold plating need only be applied to the small sensing region 34 and not to the entire printed circuit board upon which the pointing device will be soldered. This allows the supporting printed circuit board to use coarser trace pitch and unplated traces. As will be recognized by one of ordinary skill in the art, other materials may be used for traces within contact area 34 such as, for example, carbon ink.

FIG. 8d illustrates rear copper pattern 150 for first board 140. Rear copper pattern 150 places copper around and through each hole 142 in first board 140. In addition, an annular portion of copper is deposited in a region that will become the center of the bottom of each pointing device. A copper trace connects the central annular portion with one of the edge annular portions.

Figure 8E:
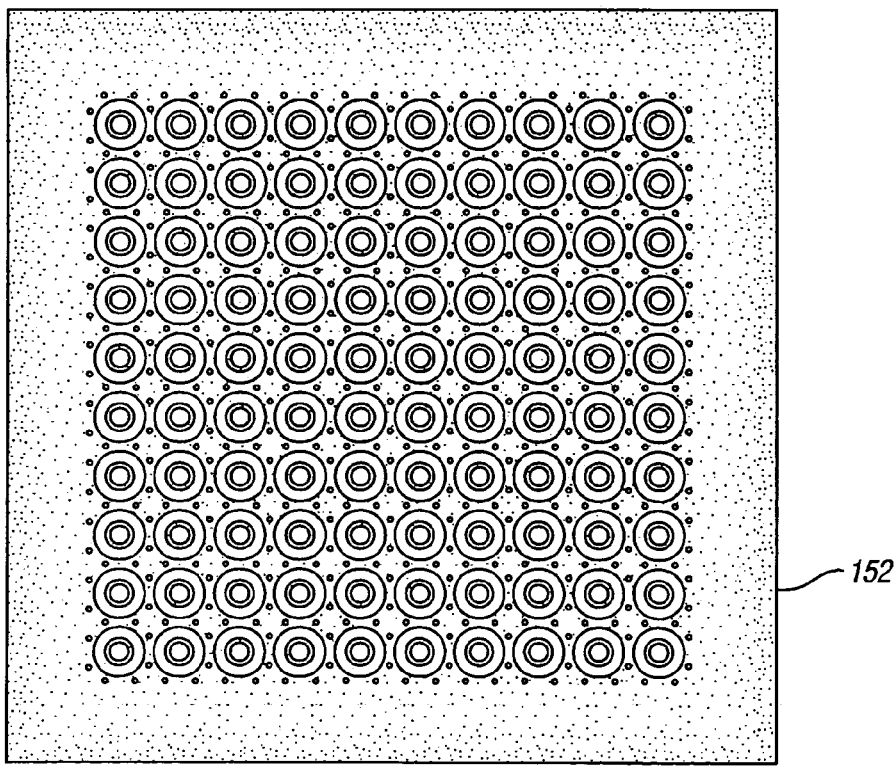
Figure 8F:
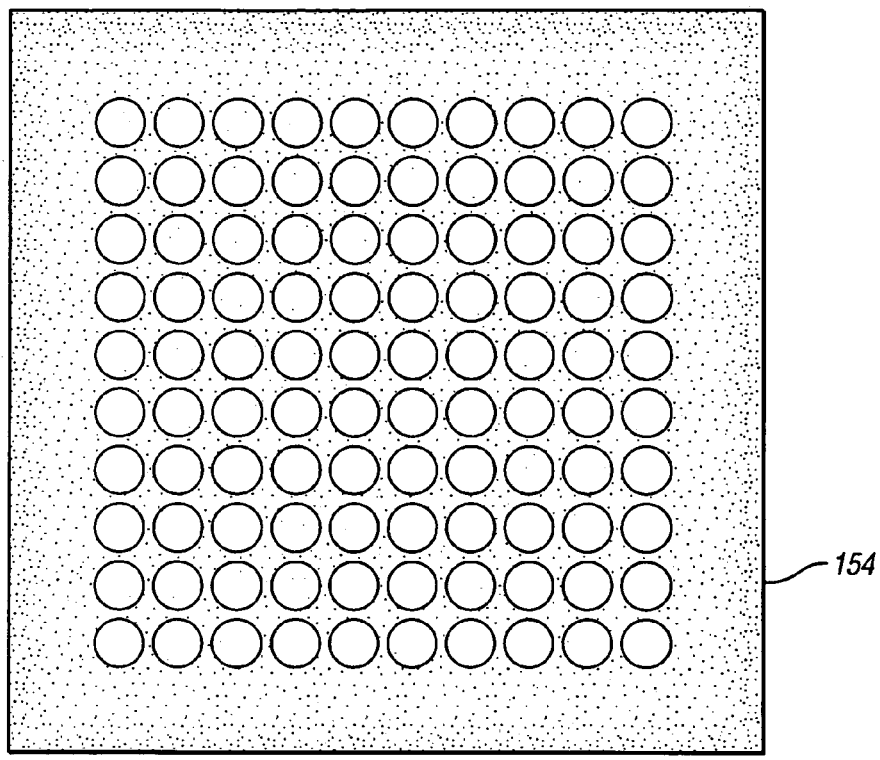

FIG. 8e illustrates soldermask pattern 152 for the front side of first board 140. Soldermask, as illustrated by pattern 152, is applied to the front side of first board 140 to provide insulation outside of sensing region 34 and to form separation region 42. Soldermask may be deposited to a thickness of 0.001 inches (0.03 mm).

A 0.005 inch (0.13 mm) polyimide sheet approximately 4.72 inches (120 mm) square is silk screened on one side with a resistive or semiconductive ink to form flexible substrate 24. A bonding film, such as Bonding Film 583 from 3M Corporation, can be used for adhesive layer 52. The bonding film is precut as illustrated by 154 in FIG. 8f. The bonding film is adhered to the polyimide sheet with an initial low temperature cure. The polyimide film is then adhered to the bottom substrate by the bonding film with a final high temperature cure.

Figure 8G:
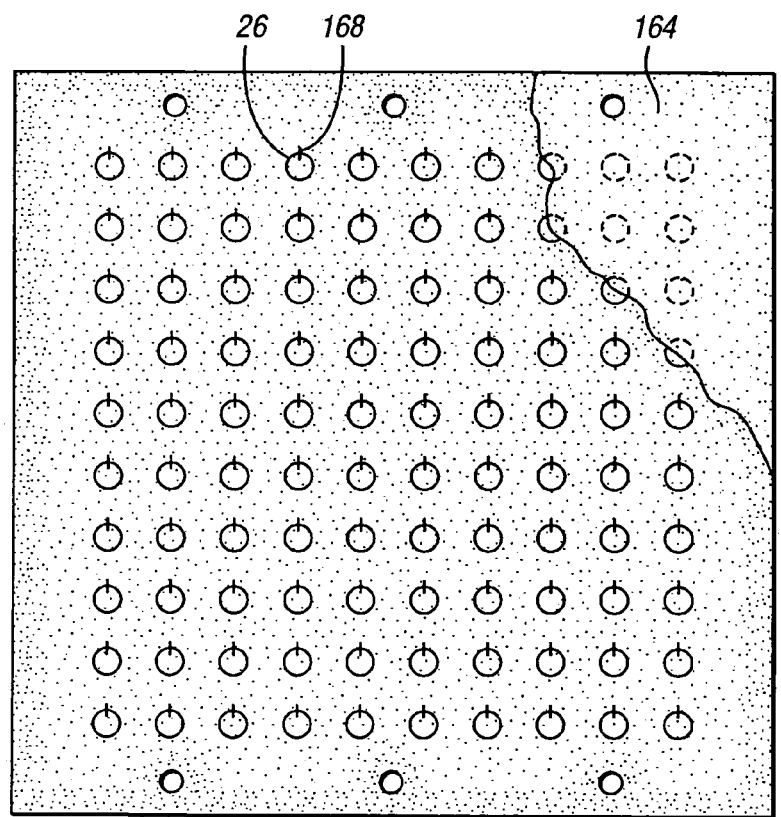
Figure 8H:
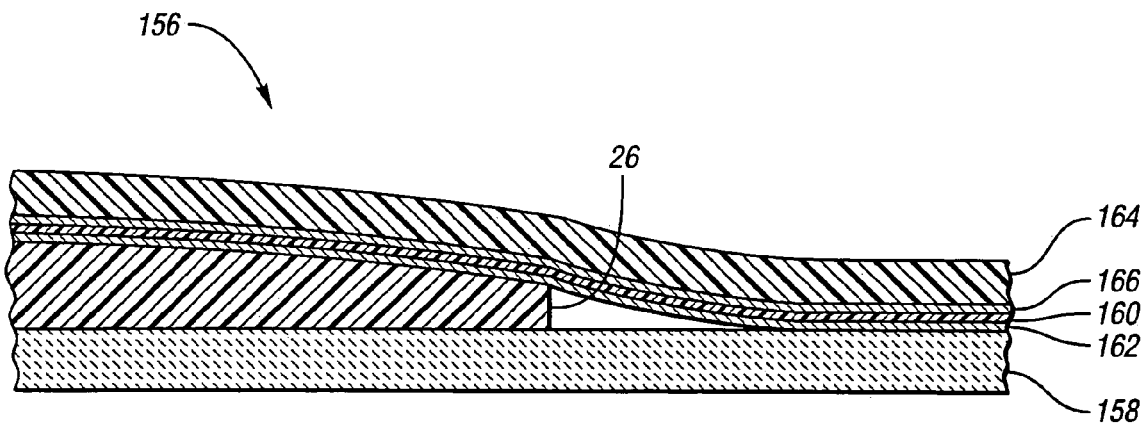

FIGS. 8g and 8h illustrate snap dome assembly 156, including one hundred snap domes 26. As can be seen in the cross-sectional view of FIG. 8h, snap dome 26 is adhered to carrier 160 using adhesive layer 162 that is compatible with high temperatures, such as Adhesive Transfer Tape 966 from 3M Corporation. Carrier 160 is formed of a flexible material that is compatible with high temperatures, such as polyimide, for supporting snap dome 26. Snap dome 26 and carrier 160 rest on liner 158, which is removed prior to assembly. Top liner 164 is attached to the top surface of carrier 160 using a low tack pressure sensitive adhesive 166. A slit of approximately 2 mm in length, shown by 168 in FIG. 8g, is laser cut through carrier 160 for release of air trapped around snap dome 26. Slit 168 may also be cut through top liner 164.

Top liner 164 and bottom liner 158 are used to assist in the manufacturing process. Top liner 164 and bottom liner 158 may be made of polyester, paper, or any other suitable material. Bottom liner 158 is removed just prior to adhering snap dome assembly 156 to the top surface of flexible substrate 24 with adhesive layer 160. Top liner 164 may then be removed.

Optional top substrates 27 may be adhered over snap dome assembly 156. Top substrates 27 are preferably made from 0.020 inch (0.51 mm) thick FR4 with a pattern similar to pattern 154 illustrated in FIG. 8f. Each top substrate 27 defines opening 28 for each pointing device 20, as illustrated in FIG. 1b.

Figure 8I:
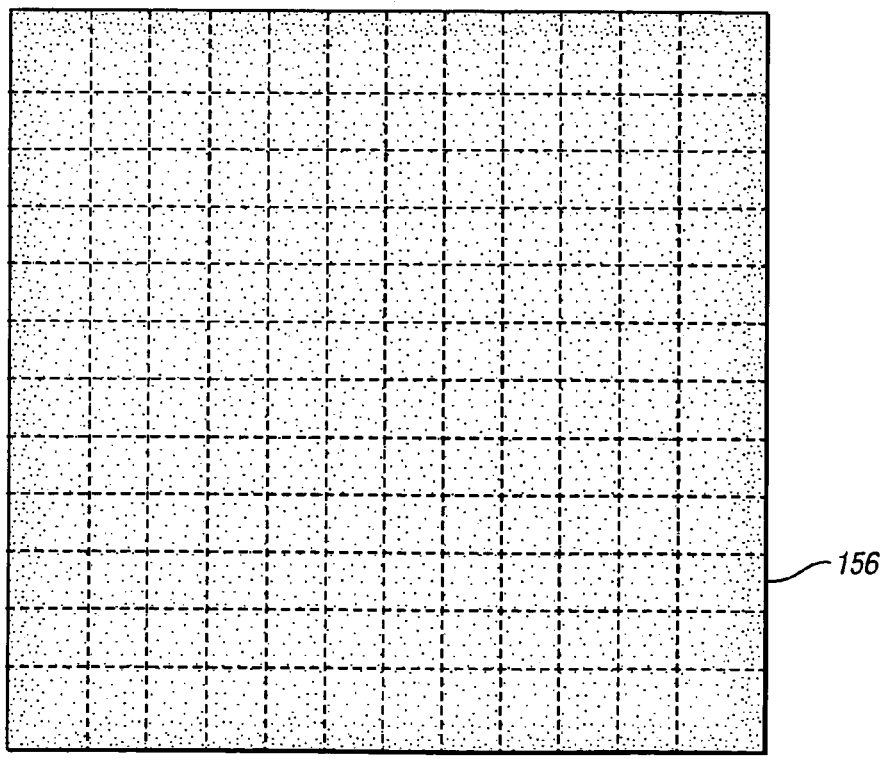

Once completed, the assembly is diced as indicated by dice pattern 168 in FIG. 8i to produce one hundred pointing devices 20. In the embodiment described, dicing cuts plated vias 142 in half to create edge connections between the front and back sides of first board 140.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A pointing device for integrating into portable electronic devices comprising:
   a bottom substrate having a top face and a bottom face, the top face including a sensing region comprising a plurality of interdigitated conductive trace regions, each trace region including interdigitated common and sense traces, the bottom substrate defining at least one via through the bottom substrate for each sense trace and the common trace, each via supporting a conductive path from one trace to at least one lead element, the bottom face supporting at least one lead element for each sense trace and the common trace, each lead element solderable to a printed circuit board;
a flexible substrate constructed from a heat resistant polymer, the flexible substrate having a resistive layer deposited on a bottom side;
a raised pedestal formed on the bottom substrate top face around at least a portion of the sensing region, the pedestal separating the plurality of the interdigitated conductive traces from the flexible substrate resistive layer;
a snap dome over the flexible substrate;
a keymat membrane covering the snap dome and the flexible substrate, the keymat membrane defining a protruding region surrounding the snap dome;
a center keycap positioned on the keymat membrane opposite the snap dome; and
a surrounding keycap positioned on the keymat membrane opposite the keymat membrane protruding region;
whereby depressing the center keycap collapses the snap dome and brings a portion of the flexible substrate under the snap dome into contact with the bottom substrate sensing region; and
whereby depressing the surrounding keycap pushes a portion of the flexible substrate protruding region which in turn pushes a portion of the flexible substrate under the portion of the flexible substrate protruding region into contact with the bottom substrate sensing region.

2. The pointing device of claim 1 wherein the plurality of interdigitated conductive trace regions comprises:
a center region under the snap dome; and
a plurality of surrounding regions encircling the center region.

3. The pointing device of claim 1 further comprising an isolating region separating the center region from the plurality of surrounding regions.

4. The pointing device of claim 3 wherein the isolating region is raised above the bottom substrate and wherein the snap dome has a rim positioned above the isolating region.

5. The pointing device of claim 1 wherein the surrounding keycap is annular in shape.

6. The pointing device of claim 1 wherein a portion of the surrounding keycap overlaps a portion of the center keycap.

7. The pointing device of claim 1 wherein the keymat membrane further defines a force transmission region within the protruding region, the force transmission region extending from the keymat membrane above the snap dome.

8. A pointing device for integrating into portable electronic devices comprising:
a bottom substrate defining a top face and a bottom face;
a central set of interdigitated conductive traces formed in a circular region on the bottom substrate top face;
an annular region surrounding the central set of interdigitated conductive traces on the bottom substrate top face, the annular region including a plurality of sets of interdigitated conductive traces;
a flexible substrate having a resistive layer deposited on a bottom side, the flexible substrate bottom side spaced above and facing the bottom substrate top surface; and
a switch assembly positioned over the flexible substrate, the switch assembly including a central keycap surrounded by an annular keycap, the switch assembly positioned such that the central keycap is above the central set of interdigitated conductive traces and the annular keycap is over the annular region.

9. The pointing device of claim 8 wherein the switch assembly further includes a keymat membrane, the keymat membrane having a top side onto which is attached the central keycap and the annular keycap.

10. The pointing device of claim 9 wherein the keymat membrane defines an annular protrusion on a bottom side of the keymat membrane, the annular protrusion forcing the flexible substrate against a portion of the annular region when the annular keycap is pressed.

11. The pointing device of claim 10 wherein the keymat membrane further defines a force transmitter inside the annular protrusion on a bottom side of the keymat membrane.

12. The pointing device of claim 8 wherein the bottom substrate defines at least one via through the bottom substrate for each trace in the central set of interdigitated conductive traces and for each trace in the plurality of sets of interdigitated conductive traces in the annular region, each via supporting a conductive path from one trace to at least one lead element, each lead element solderable to a printed circuit board.

13. An input device for an electronic system comprising:
a force sensor having a plurality of conductive interdigitated traces on a bottom substrate and a flexible substrate spaced apart from the bottom substrate, the flexible substrate having a resistive layer deposited on a bottom side facing the interdigitated traces;
a snap dome positioned over a portion of the force sensor flexible substrate;
a flexible keymat membrane having a top surface and a bottom surface positioned over the force sensor and the snap dome, the keymat membrane bottom surface facing the force sensor flexible substrate, the keymat membrane bottom surface defining a protruding region surrounding the snap dome, the protruding region spaced above the force sensor flexible substrate;
a center keycap on the keymat membrane top surface positioned over the snap dome; and
a surrounding keycap on the keymat membrane, the surrounding keycap enclosing the center keycap, the surrounding keycap positioned over the keymat membrane protruding region.

14. The input device of claim 13 wherein the surrounding keycap is annular in shape.

15. The input device of claim 13 wherein the plurality of interdigitated traces comprises:
a first set of interdigitated traces beneath the snap dome; and
at least one second set of interdigitated traces in a region around the first set of interdigitated traces.

16. The input device of claim 15 wherein the at least one second set of interdigitated traces is a plurality of sets of interdigitated traces, each set of interdigitated traces in the plurality of interdigitated traces formed in a portion of the region around the first set of interdigitated traces.

17. The input device of claim 15 wherein one trace in the first set of interdigitated traces is a common trace electrically connected with one trace in each of the at least one second set of interdigitated traces.

18. The input device of claim 15 further comprising a spacer region encircling the first set of interdigitated traces and separating the first set of interdigitated traces from the at least one second set of interdigitated traces.

19. The input device of claim 18 wherein the snap dome has a rim positioned above the spacer region.

20. The input device of claim 13 wherein the force sensor further comprises:
a raised pedestal formed on the bottom substrate around at least a portion of the plurality of interdigitated traces, the pedestal spacing the plurality of the interdigitated traces apart from the flexible substrate resistive layer; and
an adhesive spacer layer joining the flexible substrate to the bottom substrate.

21. The input device of claim 13 wherein the snap dome is affixed to a snap dome carrier membrane.

22. The input device of claim 13 wherein the center keycap extends a lesser distance above the keymat membrane then the surrounding keycap extends above the keymat membrane.

23. The input device of claim 13 wherein the center keycap and the surrounding keycap are affixed to the keymat membrane.

24. The input device of claim 13 wherein the keymat membrane further comprises a force transmitting member surrounded by the protruding region, the force transmitting member contacting the snap dome.

25. An input device comprising:
a bottom substrate having a top face and a bottom face;
a central sensing region comprising interdigitated conductive traces formed on the bottom substrate;
a separation region surrounding the central sensing region on the bottom substrate, the separation region raised above the bottom substrate;
a peripheral sensing region around the separation region, the peripheral sensing region comprising a plurality of sets of interdigitated conductive traces formed on the bottom substrate;
a raised pedestal formed on the bottom substrate top face around at least a portion of the peripheral sensing region;
a flexible substrate on the raised pedestal, the flexible substrate extending over the central sensing region, the separation region and the peripheral sensing region, the flexible substrate having a resistive layer deposited on a bottom side facing the central sensing region and the peripheral sensing region;
a snap dome membrane to which is affixed a snap dome, the snap dome having a dome rim, the snap dome membrane positioned over the flexible substrate so that the dome rim is above the separation region;
whereby compressing the snap dome forces the resistive layer on the flexible substrate above the central sensing region against the central sensing region but does not force the resistive layer on the flexible substrate above the peripheral sensing region against the peripheral sensing region.

26. The input device of claim 25 further comprising:
a plurality of lead elements defined on the bottom substrate; and
a plurality of conductive lead traces formed on the bottom substrate, each lead trace interconnecting one of the plurality of lead elements with at least one of the interdigitated conductive traces in at least one of the central sensing region and the peripheral sensing region.

27. A method of making a surface mountable pointing device comprising:
forming a thin bottom substrate material to have a top surface area of sufficient size to support a plurality of pointing devices;
for each pointing device supported, forming a plurality of through holes in the bottom substrate material;
for each pointing device supported, forming on the bottom substrate top surface at least one set of sensing conductive traces in a central sensing region, each set of sensing conductive traces including at least two electrically separate interdigitated sensing traces;
for each pointing device supported, forming on the bottom substrate top surface a plurality of sets of sensing conductive traces in a peripheral sensing region surrounding the central sensing region;
for each pointing device supported, forming at least one connecting conductive trace from each sensing conductive trace in the central sensing region and the peripheral sensing region to and into at least one of the through holes;
depositing an insulative material on the bottom substrate top surface substantially around each peripheral sensing region, the insulative material forming a raised pedestal;
forming a high temperature resistant flexible substrate sized to substantially cover the bottom substrate top surface, the flexible substrate coated with a resistive material on a bottom surface;
adhering the flexible substrate bottom surface to the bottom substrate top surface such that, for each pointing device supported, resistive material is suspended above the central sensing region and the peripheral sensing region;
adhering a snap dome support membrane to a top surface of the flexible substrate, the snap dome support membrane including one snap dome for each pointing device supported, the snap dome membrane positioned such that each snap dome is positioned over one of the central sensing regions; and
dicing the bottom substrate to separate each pointing device.

28. The method of making the surface mountable pointing device of claim 27 further comprising forming at least one conductive terminal for at least one through hole, each conductive terminal facilitating soldering of the pointing device to a printed circuit board.

29. The method of making the surface mountable pointing device of claim 27 wherein dicing cuts through at least one through hole such that the through hole forms a via along a side of the pointing device normal to the bottom substrate top surface.

30. The method of making the surface mountable pointing device of claim 27 further comprising:
forming a plurality of printed circuit board traces on a printed circuit board; and
soldering the bottom substrate to the plurality of traces on the printed circuit board.

31. The method of making the surface mountable pointing device of claim 30 further comprising:
forming a keypad membrane defining an annular protruding portion on a bottom side of the keypad membrane;
positioning the keypad membrane over the printed circuit board such that the annular protruding portion of the keypad membrane is positioned above the peripheral sensing region;
adhering an annular keycap to a top surface of the keypad membrane opposite the annular protruding portion, the annular keycap defining a central hole; and adhering a center keycap to the keypad membrane top surface inside the central hole, the center keycap positioned above the snap dome.

32. The method of making the surface mountable pointing device of claim 31 wherein the keypad membrane further defines a force transmitting member formed on the bottom side within the annular protruding portion, the force transmitting member collapsing the snap dome when the center keycap is depressed.

33. The method of making the surface mountable pointing device of claim 27 further comprising, for each pointing device supported, forming a raised separation region on the bottom substrate top surface, the raised separation region separating the central sensing region from the peripheral sensing region.

34. The method of making the surface mountable pointing device of claim 33 wherein each snap dome has a snap dome rim and wherein adhering the snap dome support membrane positions the snap dome for each pointing device such that the snap dome rim is over the raised separation region.

* * * * *